(12) United States Patent
Kim et al.

(10) Patent No.: US 9,847,870 B2
(45) Date of Patent: Dec. 19, 2017

(54) SEMICONDUCTOR DEVICE AND COMMUNICATION SYSTEM INCLUDING THE SAME

(71) Applicant: Samsung Electronics Co., Ltd., Suwon-si, Gyeonggi-do (KR)

(72) Inventors: Do-Hyung Kim, Seoul (KR); Tae-Ik Kim, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/197,746

(22) Filed: Jun. 29, 2016

(65) Prior Publication Data

US 2017/0048057 A1    Feb. 16, 2017

(30) Foreign Application Priority Data

Aug. 13, 2015    (KR) .......................... 10-2015-0114374

(51) Int. Cl.
*H04L 7/033*    (2006.01)
*H03L 7/18*    (2006.01)
(Continued)

(52) U.S. Cl.
CPC .............. *H04L 7/0331* (2013.01); *H03L 7/18* (2013.01); *H04L 27/20* (2013.01); *H04W 4/008* (2013.01)

(58) Field of Classification Search
CPC ......... H04L 7/0331; H04L 27/20; H03L 7/18; H04W 4/008
See application file for complete search history.

(56) References Cited

U.S. PATENT DOCUMENTS

| | | | | |
|---|---|---|---|---|
| 5,963,068 A | * | 10/1999 | Hardesty | ................... G06F 1/08 327/142 |
| 6,356,122 B2 | * | 3/2002 | Sevalia | ................... H03L 7/081 327/105 |

(Continued)

FOREIGN PATENT DOCUMENTS

KR    100887297 B1    3/2009

OTHER PUBLICATIONS

Chou, Ju-Ming, et al., "A 125MHz 8b Digital-to-Phase Converter," 2003 IEEE International Solid-State Circuits Conference, ISSCC 2003 / Session 24 / Clock Generation / Paper 24.8 / Feb. 12, 2003, 10 pages.

(Continued)

*Primary Examiner* — Jean B Corrielus
(74) *Attorney, Agent, or Firm* — Renaissance IP Law Group LLP

(57) ABSTRACT

Provided are a semiconductor device including a modulator for PSK communication and a semiconductor device including a demodulator for PSK communication, and a PSK communication system. The semiconductor device includes a reference clock generator to generate a reference clock signal, a phase locked loop (PLL) to receive the reference clock signal and generate a first clock signal, an integer divider circuit to generate a second clock signal by delaying a rising edge of the reference clock signal by a product of a predetermined integer value included in transmission data and a phase interval, and a processing unit to generate a first transmission signal. The first transmission signal is phase-shifted from a first rising edge of the second clock signal. The phase interval is dependent on a ratio of the frequency of the first clock signal to the frequency of the reference clock signal.

20 Claims, 22 Drawing Sheets

(51) Int. Cl.
*H04L 27/20* (2006.01)
*H04W 4/00* (2009.01)

(56) References Cited

U.S. PATENT DOCUMENTS

| | | |
|---|---|---|
| 6,794,913 B1 | 9/2004 | Stengel |
| 7,202,719 B2 | 4/2007 | Gabato et al. |
| 7,233,628 B2 * | 6/2007 | Robertson ............... H04L 25/14 375/295 |
| 7,236,552 B2 * | 6/2007 | Robertson ............... H04L 25/14 375/354 |
| 7,512,205 B1 * | 3/2009 | Erol .................... H03C 3/0925 375/375 |
| 7,620,133 B2 | 11/2009 | Cafaro et al. |
| 7,917,798 B2 | 3/2011 | Inamdar |
| 9,001,931 B2 | 4/2015 | Pebay-Peyroula et al. |
| 2010/0090761 A1 | 4/2010 | Byun et al. |

OTHER PUBLICATIONS

Hameed, Sameed, "Design of a Wide Bandwidth Phase Modulator and Modeling of Polar Transmitters with Split-band Envelope Modulation," 2013 Electronic Theses and Dissertations UCLA, Los Angeles, United States of America, 65 pages.

\* cited by examiner

1200

1300

1400

SEMICONDUCTOR DEVICE AND COMMUNICATION SYSTEM INCLUDING THE SAME

CROSS-REFERENCE TO RELATED APPLICATION

This application claims priority from Korean Patent Application No. 10-2015-0114374 filed on Aug. 13, 2015 in the Korean Intellectual Property Office, and all the benefits accruing therefrom under 35 U.S.C. 119, the contents of which in its entirety are herein incorporated by reference.

BACKGROUND

1. Technical Field

The present inventive concept relates to a semiconductor device and a communication system including the same.

2. Description of the Related Art

Semiconductor and communication technologies are integral to the functioning of the modern world. In general, a conventional phase shift keying (PSK) method is a simple and efficient modulation scheme to transmit signals by shifting a phase. According to the number of corresponding phases, a signal constellation consisting of $2^N$ (N=1, 2, 3, 4, . . . ) points is formed, and is referred to as BPSK, QPSK, 8PSK, 16PSK, . . . according to the value of N. However, since such a signal has certain characteristics to pass through an origin during transition, for example, when passing through a power amplifier (PA), when the PA does not operate linearly, the signal is severely distorted, thereby resulting in a reduction in quality. Thus, it hinders the PA from being used to its maximum capabilities.

Some semiconductor and communication technologies are related to a Near Field Communication (NFC) card. An NFC card is sometimes referred to as a smart card, a chip card, an integrated circuit (IC) card or the like, and may be operated in a passive mode or an active mode according to its operation method. In the passive mode, the NFC card performs an operation of receiving a signal transmitted from a reader. In the active mode, the NFC card performs an operation of transmitting the signal received from the reader together with transmission data back to the reader.

SUMMARY

The present inventive concept provides a semiconductor device including a modulator for PSK communication, capable of easily generating and transmitting a transmission signal by defining a phase using a product of an integer value and a phase interval (PI) value having a relatively small value in a transmitter used in the PSK communication.

The present inventive concept also provides a semiconductor device including a demodulator for PSK communication, capable of reducing noise occurring in an output signal in a phase detector used to demodulate a PSK signal.

The present inventive concept also provides a PSK communication system capable of easily modulating and demodulating a phase shift value.

However, aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

According to some embodiments of the present inventive concept, there is provided a semiconductor device including a modulator for phase shift keying (PSK) communication including a reference clock generator configured to generate a reference clock generator configured to generate a reference clock signal, a phase locked loop (PLL) configured to receive the reference clock signal and generate a first clock signal having a frequency different from a frequency of the reference clock signal, an integer divider circuit configured to generate a second clock signal by delaying a rising edge of the reference clock signal by a product of (a) a predetermined integer value included in transmission data and (b) a phase interval, and a processing unit configured to generate a first transmission signal, wherein the first transmission signal is phase-shifted from a first rising edge of the second clock signal, wherein the phase interval is dependent on a ratio of the frequency of the first clock signal to the frequency of the reference clock signal.

According to some embodiments of the present inventive concept, there is provided a semiconductor device including a modulator for phase shift keying (PSK) communication including an integer divider circuit configured to receive a first clock signal having a frequency that is a multiple of a frequency of a reference clock signal, to receive a reset reference clock signal, and to generate a second clock signal by delaying a rising edge of the reset reference clock signal by a product of (a) a predetermined integer value included in transmission data and (b) a phase interval, and a processing unit configured to generate a first transmission signal, wherein the first transmission signal is phase-shifted from a first rising edge of the second clock signal, wherein the phase interval is dependent on a ratio of the frequency of the first clock signal to the frequency of the reference clock signal.

According to some embodiments of the present inventive concept, there is provided a semiconductor device including a demodulator for phase shift keying (PSK) communication including a phase detector circuit configured to receive a first clock signal and generate a second clock signal by detecting a phase shift value of the first clock signal, a phase locked loop (PLL) configured to generate a third clock signal having a frequency that is a multiple of a frequency of a reference clock signal, and a counter unit configured to calculate an integer value corresponding to a delayed phase value by comparing the second clock signal with the third clock signal, wherein the phase detector circuit is configured to cause the second clock signal to have a logic level value corresponding to a width between a first rising edge of the reference clock signal and a first rising edge of the first clock signal, and wherein when a second rising edge of the first clock signal is ahead of a second rising edge of the reference clock signal, the phase detector circuit is configured to cause the second clock signal to have a logic level value corresponding to a width between the second rising edge of the reference clock signal and a second rising edge closest to and after the first rising edge of the first clock signal.

According to some embodiments of the present inventive concept, there is provided a PSK communication system including a transmitter configured to include a reference clock generator, a pulse generator circuit, a first phase locked loop, an integer divider circuit, and a processing unit, and a receiver configured to include a phase detector circuit, a second phase locked loop, and a counter unit, wherein the reference clock generator is configured to generate a reference clock signal, wherein the pulse generator circuit is configured to receive the reference clock signal and generate a reset reference clock signal, wherein the first phase locked loop is configured to receive the reference clock signal and generate a first clock signal, wherein the integer divider circuit is configured to generate a second clock signal by delaying a rising edge of the reset reference clock signal by a product of (a) a predetermined integer value included in transmission data and (b) a phase interval, wherein the processing unit is configured to generate a first signal, wherein the first signal is phase-shifted from a rising edge of the second clock signal, wherein the phase detector circuit is configured to receive the first signal and generate a third clock signal by detecting a phase shift value, wherein the second phase locked loop is configured to generate a fourth clock signal, and wherein the counter unit is configured to calculate the integer value by comparing the third clock signal with the fourth clock signal.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
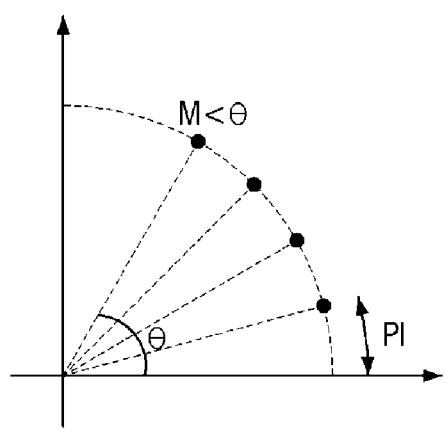
FIGS. 1 to 3 are diagrams for explaining a method for performing PSK communication using a semiconductor device according to some embodiments of the present inventive concept.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

The term "unit" or "module," as used herein, means, but is not limited to, a software or hardware component, such as a field programmable gate array (FPGA) or an application specific integrated circuit (ASIC), which performs certain tasks. A unit or module may advantageously be configured to reside in the addressable storage medium and configured to execute on one or more processors. Thus, a unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units or modules may be combined into fewer components and units or modules or further separated into additional components and units or modules.

Figure 2:
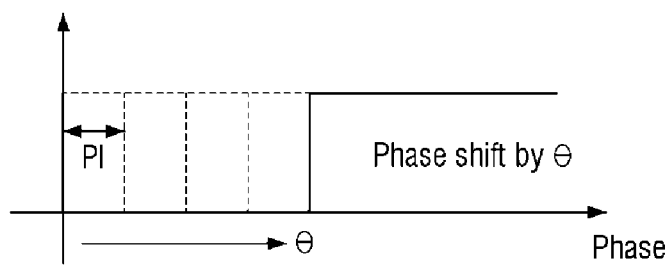
Figure 3:
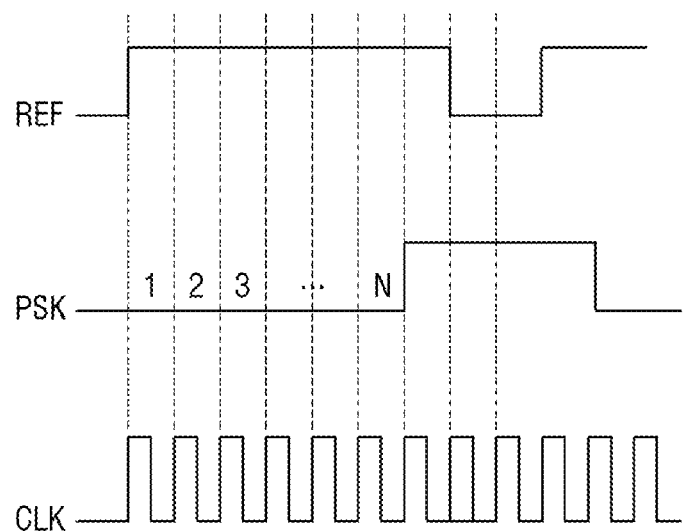

FIGS. 1 to 3 are diagrams for explaining a method for performing PSK communication using a semiconductor device according to some embodiments of the present inventive concept. A PSK communication method is one kind of RF communication method. The method involves performing communications by adjusting a phase shift amount depending on a magnitude of a signal. A digital-to-phase converter (DPC) is a device which converts a digital signal into a specific phase shift signal, and outputs a signal corresponding to a phase-to-digital converter (PDC). The DPC device outputs a signal such that the phase shift amount increases as the value of the digital signal increases. Reference is now made to FIGS. 1 through 3.

Referring to FIG. 1, in the DPC device, a phase interval (PI) is used as a minimum unit amount in order to convert a digital signal into a phase shift signal. For example, when the magnitude of the signal is M and the phase is θ, a phase shift signal can be generated by using only θ and neglecting M that is less important in the PSK communication. That is, a digital signal may be converted into a phase shift signal by using θ=PI*N (i.e., PI multiplied by N), where N is an integer value. Specifically, assuming that N of the transmission data is 4 and a preset value of PI is 16°, then the output phase shift signal is a 64° phase-shifted signal.

Referring to FIGS. 2 and 3, the value of PI is a preset value, and N is a different value according to the transmission data. In other words, particular transmission data can include a predetermined integer value N. The PSK signal is generated by shifting a phase by a product of PI and N. A reference clock REF may be delayed by N by using a clock such as a multiplied clock CLK. The delayed signal is the PSK signal.

According to some embodiments of the present inventive concept, since the PSK signal can be generated using only a phase domain, it is possible to perform PSK communication in a one-dimensional domain. Accordingly, it is possible to reduce the burden of the overall system, and an I/Q channel becomes unnecessary. Thus, the PSK communication can be performed without an analog mixer.

Further, the PI may be determined by using 360°/M (i.e., 360° divided by M), where M may be determined from F(CLK)=F(REF)*M. F(CLK) is a frequency of the multiplied clock, and F(REF) is a frequency of the reference clock. Once the F(CLK) and the F(REF) are known, then the equation can be solved for M to determine the value of M. That is, M=F(CLK)/F(REF) can be established, and therefore, PI=360°/M can be established. In other words, the phase interval PI is dependent on a ratio of the frequency of the first clock to the frequency of the reference clock.

Figure 4A:
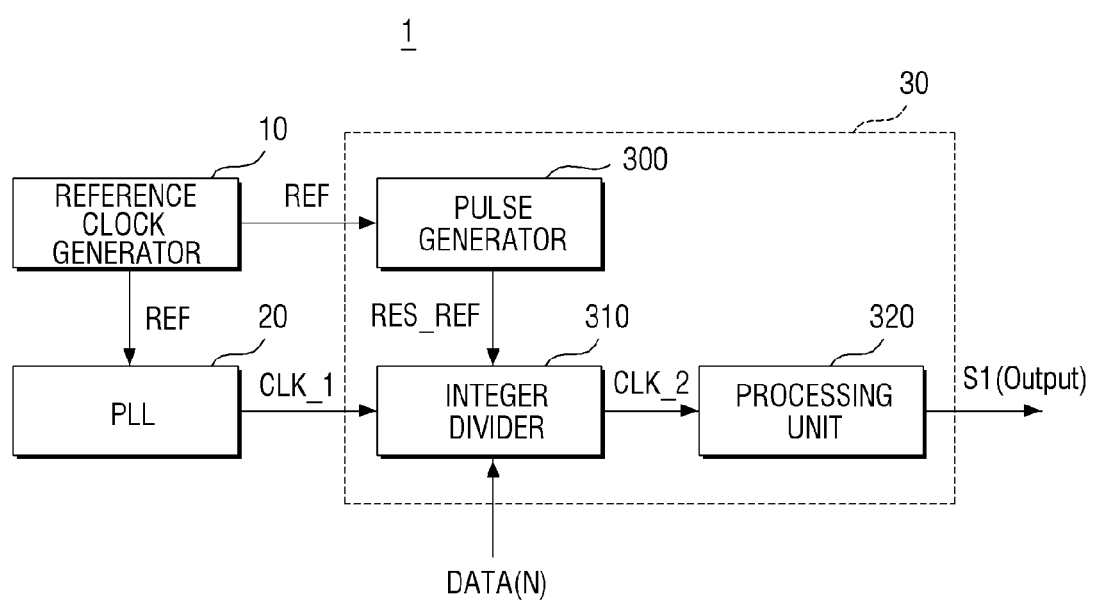
FIG. 4A is a block diagram of a semiconductor device according to some embodiments of the present inventive concept.
Figure 4B:
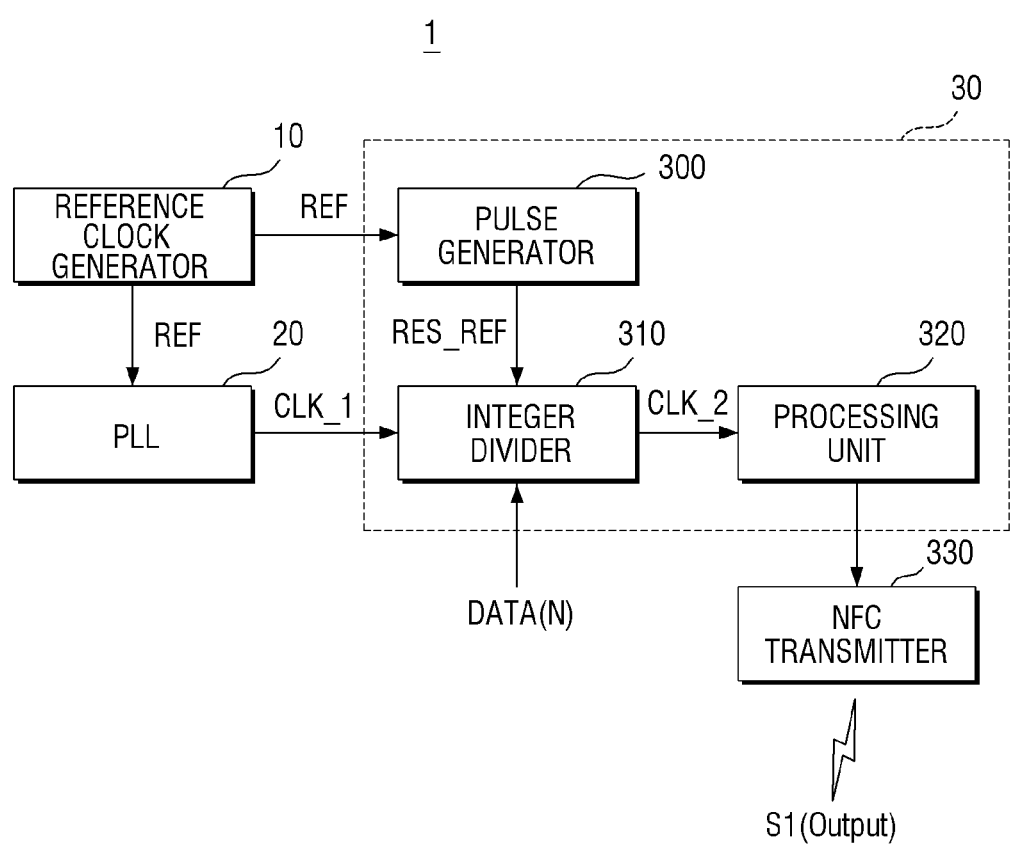
FIG. 4B is a block diagram of a semiconductor device including an NFC transmitter according to some embodiments of the present inventive concept.
Figure 5:
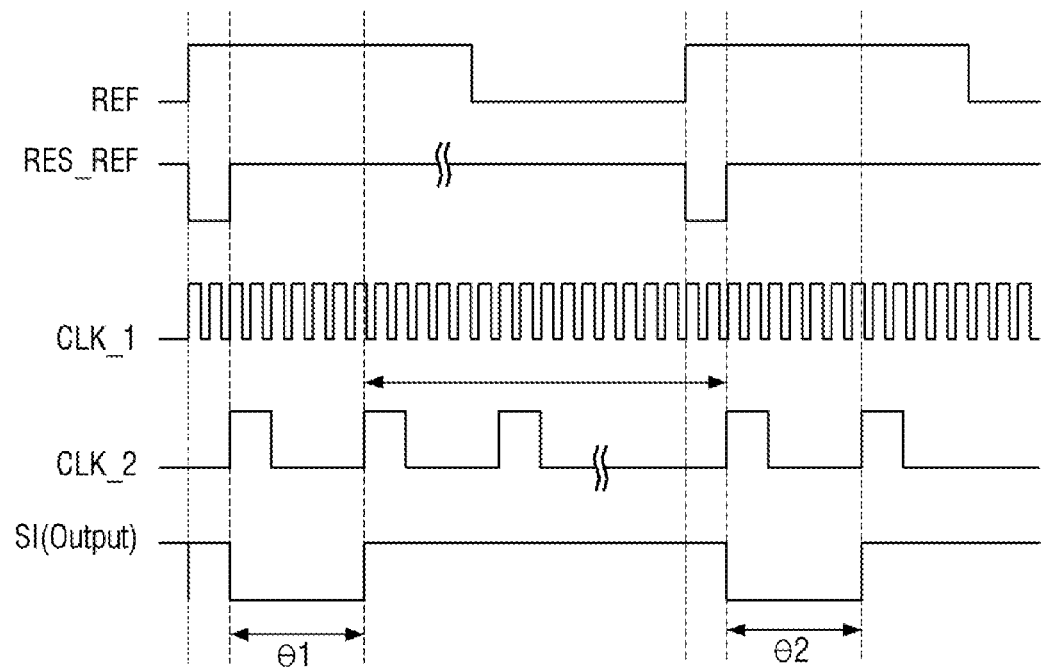
FIG. 5 is a timing diagram for explaining an operation of a semiconductor device according to some embodiments of the present inventive concept.

FIG. 4A is a block diagram of a semiconductor device according to some embodiments of the present inventive concept. FIG. 4B is a block diagram of a semiconductor device including an NFC transmitter according to some embodiments of the present inventive concept. FIG. 5 is a timing diagram for explaining the operation of a semiconductor device according to some embodiments of the present inventive concept. Reference is now made to FIGS. 4A, 4B, and 5.

Referring to FIG. 4A, a semiconductor device 1 includes a reference clock generator 10, a first phase locked loop 20, and a DPC device 30. The reference clock generator 10 generates the reference clock REF and provides the reference clock REF to the first phase locked loop 20 and/or a pulse generator circuit 300 of the DPC device 30. In some embodiments of the present inventive concept, the reference clock REF may have a first frequency f1. The first frequency f1 may be, for example, 13.56 MHz, but the present inventive concept is not limited thereto.

The first phase locked loop 20 receives the reference clock REF from the reference clock generator 10, and generates a first clock CLK_1 having a frequency different from the frequency of the reference clock REF. For example, the frequency of the first clock CLK_1 may be a second frequency f2. In this case, a ratio of the second frequency f2 to the first frequency f1 is M, and PI may be determined by 360°/M. That is, M=f2/f1 may be established, and therefore, PI=360°/M may be established. In other words, the phase interval PI is dependent on a ratio of the frequency of the first clock CKK_1 to the frequency of the reference clock REF.

The DPC device 30 may include the pulse generator circuit 300, an integer divider circuit 310, and a processing unit 320. The pulse generator circuit 300 may receive the reference clock REF from the reference clock generator 10, and generate a reset reference clock RES_REF. The reset reference clock RES_REF may be provided to the integer divider circuit 310. In this case, the pulse generator circuit 300 may generate the reset reference clock RES_REF according to a predetermined period.

The integer divider circuit 310 may receive the first clock CLK_1 from the first phase locked loop 20, and may receive the reset reference clock RES_REF from the pulse generator circuit 300. The integer divider circuit 310 may generate a second clock CLK_2 by delaying the rising edge of the reset reference clock RES_REF by a product of a predetermined integer value N included in the transmission data DATA and the phase interval PI.

FIG. 5 illustrates that the reset reference clock RES_REF is generated from the reference clock REF. In order to perform PSK communication, a communication start point may be set by initially performing a reset operation. By the reset reference clock RES_REF, it is possible to clear the existing data. By calculating the number N of clocks of the first clock CLK_1 from the first rising edge of the reset reference clock RES_REF, a phase shift amount to be delayed can be obtained.

The integer divider circuit 310 may calculate the number of clocks of the first clock CLK_1 based on the first rising edge of the reset reference clock RES_REF. In addition, the integer divider circuit 310 may determine the rising edge of the second clock CLK_2, which is delayed by N. In the second clock CLK_2, a width between the first rising edge and the second rising edge closest to the first rising edge is a phase shift value. A clock after the second rising edge need not be used, and the above process may be repeated again after providing a new reset reference clock RES_REF, thereby generating a phase-shifted signal.

Referring to FIGS. 4A and 5, the processing unit 320 may generate a first transmission signal S1 which is phase-shifted from the first rising edge of the second clock CLK_2. The processing unit 320 may receive the second clock CLK_2 from the integer divider circuit 310 and generate the first transmission signal S1, which is phase-shifted by the width between the first rising edge of the second clock CLK_2 and the second rising edge closest to the first rising edge of the second clock CLK_2. In other words, the processing unit 320 may generate the phase-shifted first transmission signal S1 based at least on the second clock CLK_2 signal.

The first transmission signal S1 is a phase-shifted signal and an output signal of PSK communication. By using this phase-shifted signal, the transmitter side transmits a PSK signal, and the receiver side receives and demodulates the signal, thereby performing PSK communication.

Referring to FIG. 5, when a new reset reference clock RES_REF is inputted (e.g., received by the integer divider circuit 310), a phase shift amount is changed in response to a new integer value by repeatedly performing the above-described operation. The processing unit 320 may generate a transmission signal having a phase shift value different from the first transmission signal S1. For example, the phase shift value of the first transmission signal S1 may be θ1, and the phase shift value of the next transmission signal (e.g., S2) may be θ2, and so forth. When different phase shift values are used, different data may be transmitted.

Referring to FIG. 4B, the semiconductor device 1 may include, for example, an NFC transmitter 330 for near field wireless communications. However, the present inventive concept is not limited thereto. The NFC transmitter 330, or other suitable transmitter, may receive the the first transmission signal S1, the next transmission signal S2, and so forth from the processing unit 320, and may wirelessly transmit, for example, the first transmission signal S1, the next transmission signal S2, and so forth.

Figure 6:
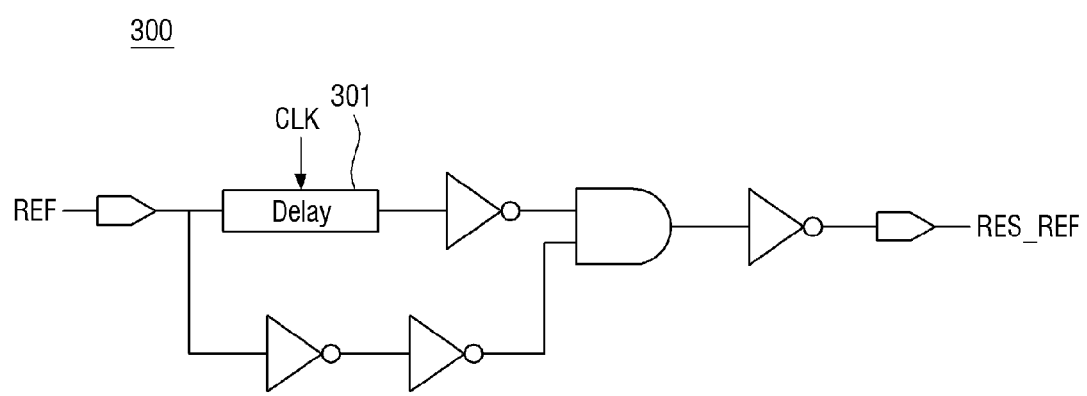
FIG. 6 is a block diagram specifically showing a pulse generator circuit of FIGS. 4A and 4B.
Figure 7:
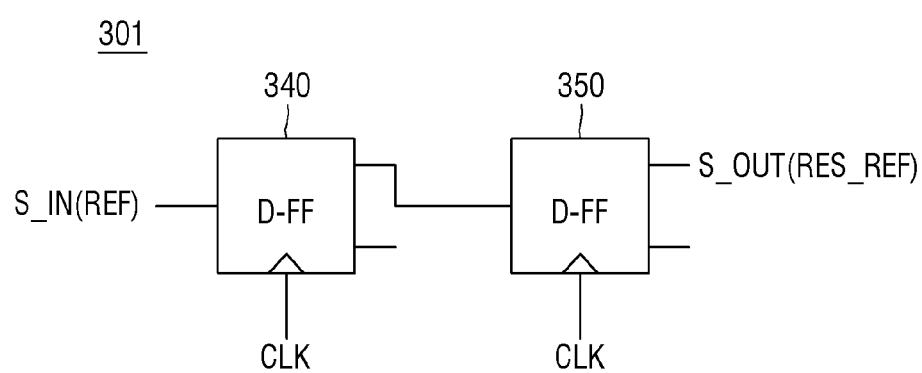
FIG. 7 is a block diagram specifically illustrating a delay unit of FIG. 6.
Figure 8:
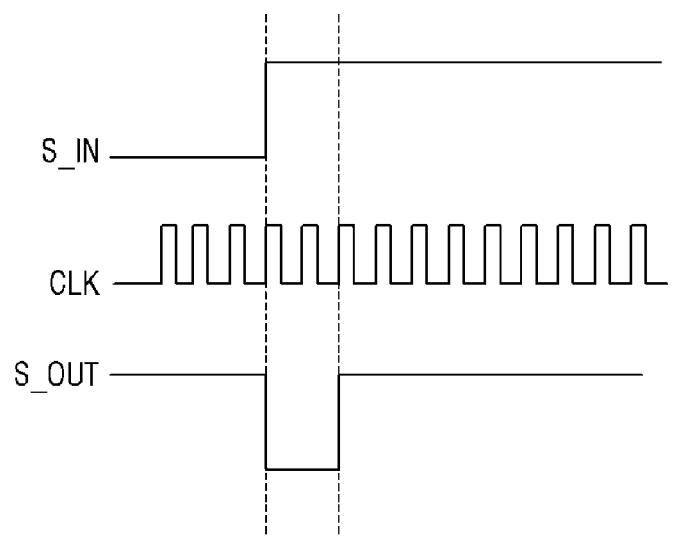
FIG. 8 is a timing diagram for explaining an operation of the pulse generator circuit of FIG. 6.

FIG. 6 is a block diagram specifically showing a pulse generator of FIGS. 4A and 4B. FIG. 7 is a block diagram specifically illustrating a delay unit of FIG. 6. FIG. 8 is a timing diagram for explaining the operation of the pulse generator of FIG. 6. Reference is now made to FIGS. 6 through 8.

Referring to FIGS. 6 and 7, a delay unit 301 of the pulse generator circuit 300 may be formed using one or more flip-flop (FF) circuits (e.g., 340 and 350). In other words, the delay unit 301 of the pulse generator circuit 300 may include one or more FF circuits (e.g., 340 and 350). The delay unit 301 serves to generate a pulse to reset the integer divider circuit 310 with a period of the reference clock REF. That is, the pulse generator circuit 300 generates the reset reference clock RES_REF and provides it to the integer divider circuit 310 (of FIGS. 4A and 4B). A reset operation may be performed for each period of the reference clock REF because the second clock CLK_2 may be updated for each period of the reference clock REF. Accordingly, the phase shift value of the output signal of the DPC device 30 (of FIGS. 4A and 4B) may be updated according to the period of the reference clock REF.

The delay unit 301 may generally be formed by using an inverter and a capacitor. However, when the rising/falling time is adjusted by the size of the capacitor, it is influenced by process, voltage, and temperature (PVT) effects, which is problematic. Further, at the fast corner from among the semiconductor process corners, the pulse width becomes narrow, and the pulse may even disappear. Thus, the pulse size must otherwise be designed to be large, which can be problematic in terms of performance.

According to some embodiments of the present inventive concept, the delay unit 301 of the pulse generator circuit 300 includes one or more FF circuits (e.g., 340 and 350). Thus, it is possible to generate a pulse width that is independent of the PVT effects.

Referring to FIG. 8, the pulse generator circuit 300 may generate an output signal (S_OUT) by delaying an input signal (S_IN) by a specific number of clocks of the clock CLK. For example, the output signal S_OUT may correspond to the reset reference clock RES_REF, and the input signal S_IN may correspond to the reference clock REF.

Figure 9:
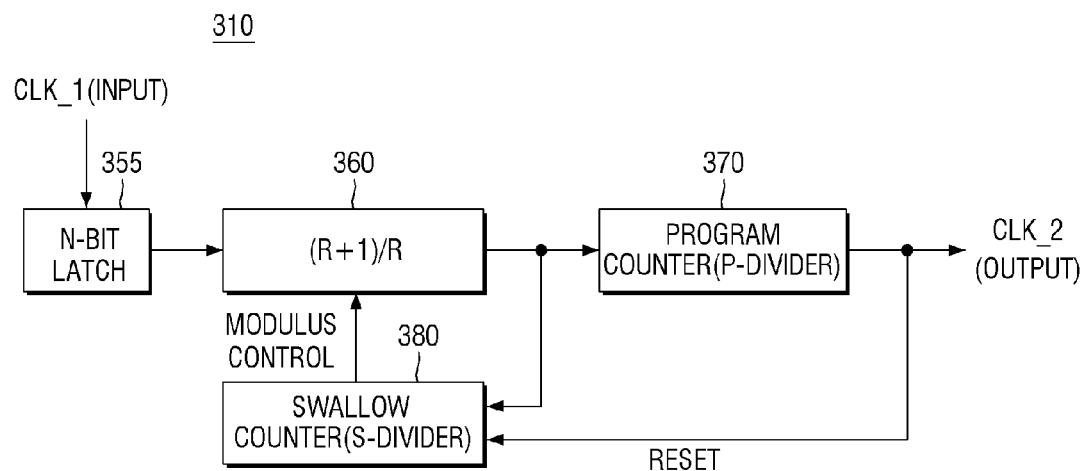
FIG. 9 is a block diagram specifically illustrating an integer divider circuit of FIGS. 4A and 4B.

FIG. 9 is a block diagram specifically illustrating an integer divider of FIGS. 4A and 4B.

Referring to FIG. 9, the input signal of the integer divider circuit 310 is the first clock CLK_1, and the output signal of the integer divider circuit 310 is the second clock CLK_2. FIG. 9 shows a structure of a swallow divider, including an N-bit latch 355, a divider block 360, a program counter 370, and a swallow counter 380. The integer divider circuit 310 is an N-integer divider with a latched N-input. The swallow counter 380 receives a signal from the divider block 360 and the program counter 370 (i.e., RESET signal), and produces a modulus control signal. The modulus control signal is received and processed by the divider block 360.

Figure 10:
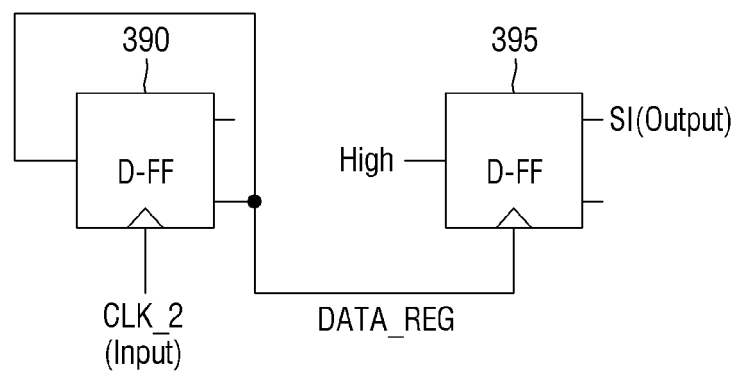
FIG. 10 is a block diagram specifically showing a processing unit of FIGS. 4A and 4B.
Figure 11:
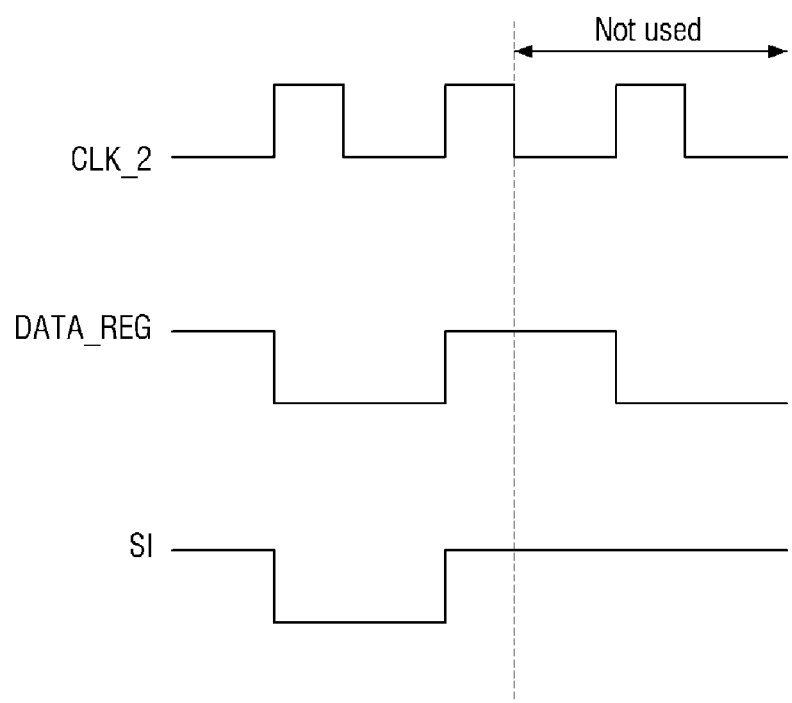
FIG. 11 is a timing diagram for explaining an operation of the processing unit of FIG. 10.

FIG. 10 is a block diagram specifically showing a processing unit of FIGS. 4A and 4B. FIG. 11 is a timing diagram for explaining the operation of the processing unit of FIG. 10.

Referring to FIGS. 10 and 11, the processing unit 320 may be formed by using an FF circuit. In other words, the processing unit 320 may include one or more FF circuits (e.g., 390 and 395). The processing unit 320 may receive the second clock CLK_2 as an input, sample only the width of the first rising edge and the second rising edge of the second clock CLK_2 as DATA_REG, and output the first transmission signal S1 that is a phase-shifted signal by using the sampled DATA_REG, as is shown in the timing diagram of FIG. 11. A PSK transmission signal may be outputted again by resetting the operation for each period of the reference clock REF.

Figure 12A:
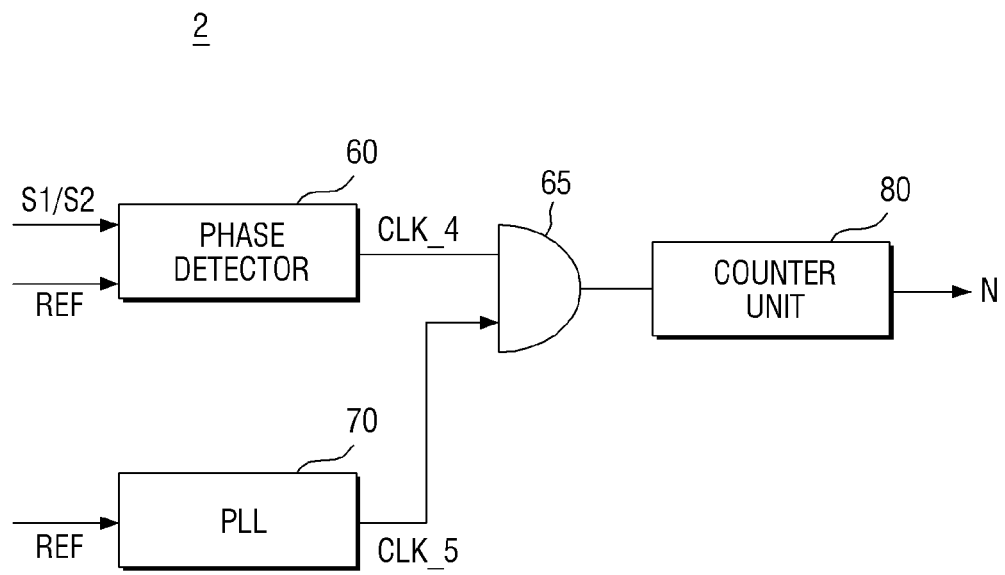
FIG. 12A is a block diagram of a semiconductor device according to some embodiments of the present inventive concept.
Figure 12B:
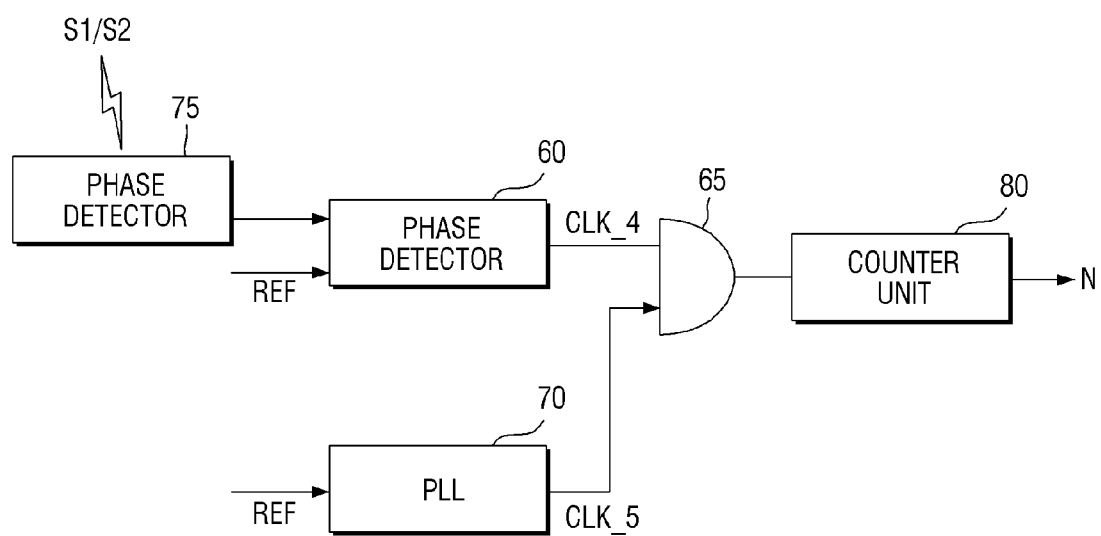
FIG. 12B is a block diagram of a semiconductor device including an NFC receiver according to some embodiments of the present inventive concept.
Figure 13:
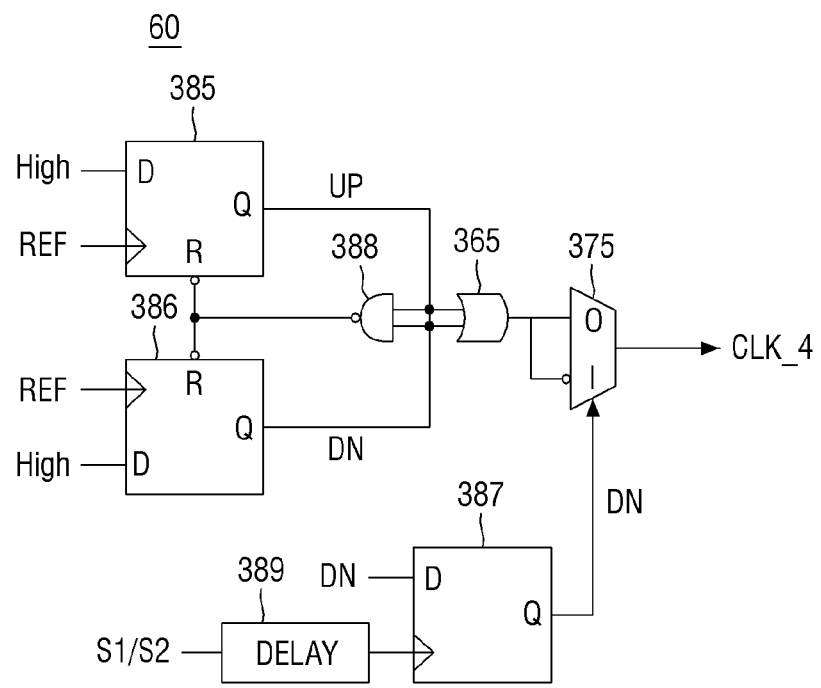
FIG. 13 is a block diagram specifically illustrating a phase detector circuit of FIGS. 12A and 12B.
Figure 14:
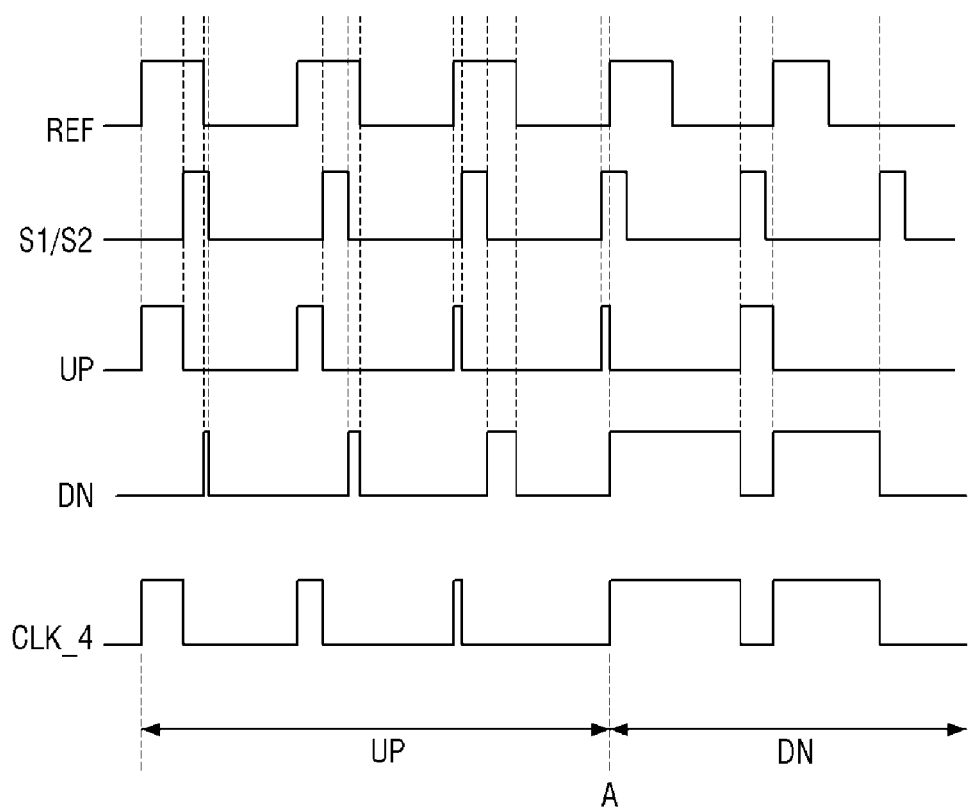
FIG. 14 is a timing diagram for explaining an operation of the phase detector circuit of FIG. 13.

FIG. 12A is a block diagram of a semiconductor device according to some embodiments of the present inventive concept. FIG. 12B is a block diagram of a semiconductor device including an NFC receiver according to some embodiments of the present inventive concept. FIG. 13 is a block diagram specifically illustrating a phase detector circuit of FIG. 12A. FIG. 14 is a timing diagram for explaining the operation of the phase detector circuit of FIG. 13. Reference is now made to FIGS. 12A, 12B, 13, and 14.

Referring to FIG. 12A, a semiconductor device 2 according to some embodiments of the present inventive concept includes a phase detector circuit 60, a second phase locked loop 70, and a counter unit 80. The phase detector circuit 60 may receive a first transmission signal S1 or a second transmission signal S2, and generate a fourth clock CLK_4 by detecting the phase shift value of the second transmission signal S2.

Specifically, the phase detector circuit 60 may receive the reference clock REF and detect the phase shift value by comparing the reference clock REF with the first transmission signal S1 or the second transmission signal S2. When the phase detector circuit 60 receives the first transmission signal S1, when the frequency of the reference clock REF is a third frequency f3 and the frequency of the first transmission signal S1 is a fourth frequency f4, a ratio of the fourth frequency f4 to the third frequency f3 is M1, and PI may be determined by 360°/M1. That is, M1=f4/f3 may be established, and therefore, PI=360°/M1 may be established. In other words, the phase interval PI is dependent on a ratio of the fourth frequency of the first transmission signal S1 to the third frequency of the reference clock REF.

Alternatively, when the phase detector circuit 60 receives the second transmission signal S2, when the frequency of the reference clock REF is the third frequency f3 and the frequency of the first transmission signal S1 is a fifth frequency f5, a ratio of the fifth frequency f5 to the third frequency f3 is M2, and PI may be determined by 360°/M2. That is, M2=f5/f3 may be established, and therefore, PI=360°/M2 may be established. In other words, the phase interval PI is dependent on a ratio of the fifth frequency of the transmission signal S1 to the third frequency of the reference clock REF.

Referring to FIG. 13, the phase detector circuit 60 may calculate the phase shift amount between the reference clock REF and the first transmission signal S1 or the second transmission signal S2 from the pulse width, generate the fourth clock CLK_4, and provide the fourth clock CLK_4 to the counter unit 80 (of FIGS. 12A and 12B).

The phase detector circuit 60 according to some embodiments of the present inventive concept includes an OR gate circuit 365 and an inverting circuit 375. Generally, an SR latch circuit may be used, but it is vulnerable to an electromagnetic noisy environment. Thus, a structure of the phase detector circuit 60 according to some embodiments of the present inventive concept may be used instead, which reduces the vulnerability to the electromagnetic noisy environment. The phase detector circuit 60 can include one or more FFs (e.g., 385, 386, and 387) and a NAND gate circuit 388. A delay circuit 389 can receive the first transmission signal S1 or the second transmission signal S2, and delay the corresponding transmission signal. The FF 387 can receive the delayed transmission signal and control the inverting circuit 375. Each of the FFs 385 and 386 can receive a logical High signal and the reference clock REF signal. The FF 385 and the FF 386 can be coupled to each other. The inverting circuit 375 can output the fourth clock CLK_4.

The phase detector circuit 60 according to some embodiments of the present inventive concept may be optimized for a PDC device, which can be used in PSK communications. In order to minimize the influence of electromagnetic noise, the phase detector circuit 60 uses an edge-trigger method to constantly output one output signal as a pulse width between the reference clock REF and the first transmission signal S1 or the second transmission signal S2.

Referring to FIGS. 13 and 14, the rising edge of the reference clock REF may be behind (i.e., later in time) than the rising edge of the first transmission signal S1 or the second transmission signal S2, which is the case after the point A. In this case, the first transmission signal S1 or the second transmission signal S2 is ahead (i.e., earlier in time) relative to the reference clock REF, and in such scenario, the transmission signal is inverted by the inverting circuit 375 (i.e., by selecting the MUX as 1). Since the inverted signal is an output signal constantly outputted as a width between the rising edge of the reference clock REF and the rising edge of the first transmission signal S1 or the second transmission signal S2, the PDC device can be operated normally. In other words, the phase detector circuit 60 may cause the CLK_4 to have a logic level value corresponding to a width between a second rising edge of the reference clock signal and a second rising edge closest to and after the first rising edge of the first clock signal Specifically, referring to FIG. 14, when the reference clock REF is ahead of (i.e., earlier in time) the first transmission signal S1 or the second transmission signal S2, the phase detector circuit 60 outputs an UP signal clock as the fourth clock CLK_4. Conversely, when the first transmission signal S1 or the second transmission signal S2 is ahead of (i.e., earlier in time) the reference clock REF, the phase detector circuit 60 outputs a DN signal clock as the fourth clock CLK_4.

The fourth clock CLK_4 has a width corresponding to between the rising edge of the reference clock REF and the rising edge of the first transmission signal S1 or the second transmission signal S2 as a logic level value. For example, the logic level value may be a high level logical value. Since the first transmission signal S1 or the second transmission signal S2 is ahead of (i.e., earlier in time) the reference clock REF at point A as shown in FIG. 14, the UP signal clock is outputted as the fourth clock CLK_4 before the point A, and the DN signal clock is outputted as the fourth clock CLK_4 after the point A.

Referring again to FIG. 12A, the second phase locked loop 70 may generate a fifth clock CLK_5 having a frequency that is a multiple of the frequency of the reference clock REF, and provide the fifth clock CLK_5 to the counter unit 80. The counter unit 80 may calculate and output an integer value N corresponding to the delayed phase value by comparing the fourth clock CLK_4 with the fifth clock CLK_5 using, for example, an OR gate circuit 65. The counter unit 80 may calculate the integer value N as a ratio of the phase shift value θ to the PI. When the integer value N is determined, the data can be demodulated accordingly.

Referring to FIG. 12B, the semiconductor device 2 may include, for example, an NFC receiver 75 for near field wireless communications. However, the present inventive concept is not limited thereto. The NFC receiver 75, or other suitable receiver, can wirelessly receive, for example, the first transmission signal S1, the next transmission signal S2, and so forth, and provide the first transmission signal S1, the next transmission signal S2, and so forth, to the phase detector circuit 60.

Figure 15:
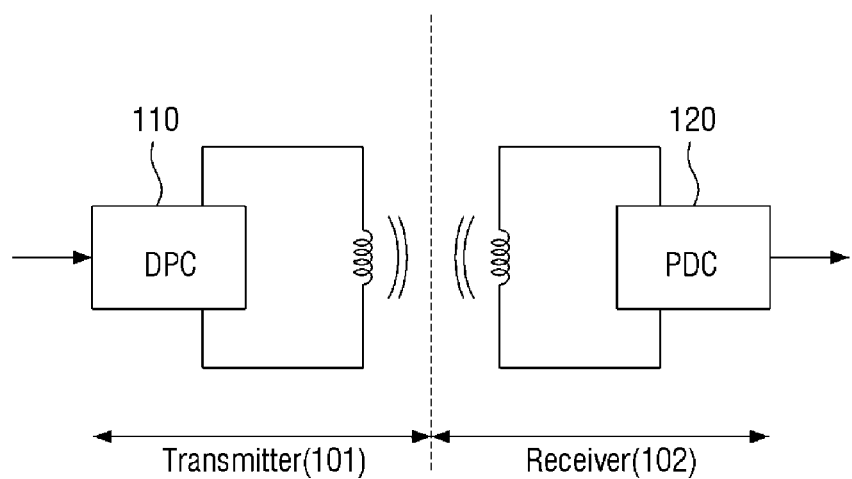
FIG. 15 schematically shows an NFC card to which a semiconductor device according to some embodiments of the present inventive concept has been applied.

FIG. 15 schematically shows an NFC card to which a semiconductor device according to some embodiments of the present inventive concept has been applied.

Referring to FIG. 15, the semiconductor device according to some embodiments of the present inventive concept may be applied to or otherwise include a transmitter 101 and/or a receiver 102 to facilitate the NFC communications. The transmitter 101 may include a DPC device 110, and the DPC device 110 may include the reference clock generator 10 (of FIGS. 4A and 4B), the pulse generator circuit 300 (of FIGS. 4A and 4B), the first phase locked loop 20 (of FIGS. 4A and 4B), the integer divider circuit 310 (of FIGS. 4A and 4B), and the processing unit 320 (of FIGS. 4A and 4B), which are described in detail above.

Further, the receiver 102 may include a PDC device 120. The PDC device 120 may include the phase detector circuit 60 (of FIGS. 12A and 12B), the second phase locked loop 70 (of FIGS. 12A and 12B), and the counter unit 80 (of FIGS. 12A and 12B), which are described in detail above.

However, the present inventive concept is not limited thereto. For example, the transmitter 101 and the receiver 102 may be applied to a communication system using PSK communication.

Figure 16:
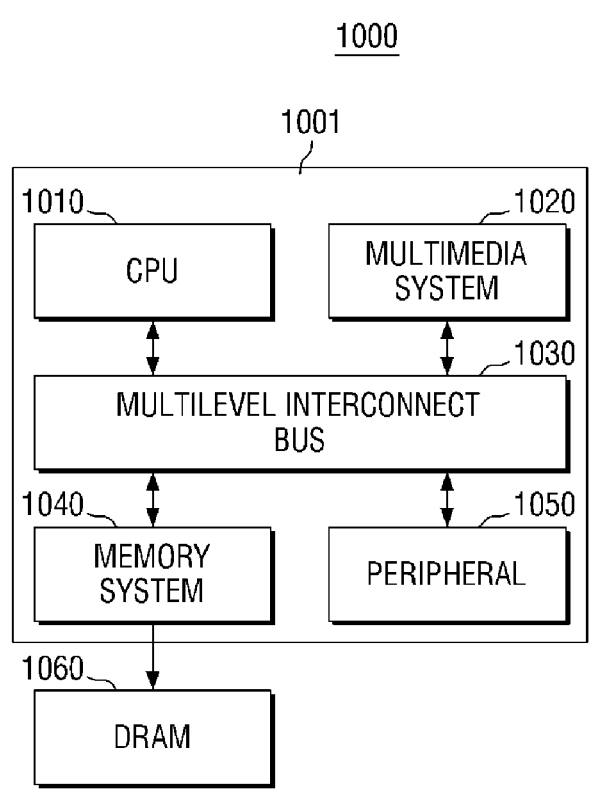
FIG. 16 is a block diagram of an SoC system including a semiconductor device according to embodiments of the present inventive concept.

FIG. 16 is a block diagram of an SoC system including a semiconductor device according to embodiments of the present inventive concept. Referring to FIG. 16, a SoC system 1000 may include an application processor 1001 and a DRAM 1060. The application processor 1001 may include a central processing unit 1010, a multimedia system 1020, a bus 1030, a memory system 1040, and a peripheral circuit 1050.

The central processing unit 1010 may execute operations required for operating the SoC system 1000. In some embodiments of the present inventive concept, the central processing unit 1010 may execute operations in a multi-core environment including a plurality of cores.

The multimedia system 1020 may be used to perform various multimedia functions in the SoC system 1000. The multimedia system 1020 may include a 3D engine module, a video codec, a display system, a camera system, a post-processor, and the like.

The bus 1030 may be used in data communication between the central processing unit 1010, the multimedia system 1020, the memory system 1040 and the peripheral circuit 1050. In some embodiments of the present inventive concept, the bus 1030 may have a multi-layer structure. Specifically, as an example of the bus 1030, a multi-layer Advanced High-performance Bus (AHB), or a multi-layer Advanced eXtensible Interface (AXI) may be used, but the present inventive concept is not limited thereto.

The memory system 1040 may provide an environment necessary for the application processor 1001 to be connected to an external memory (e.g., DRAM 1060) and perform a high-speed operation. In some embodiments of the present inventive concept, the memory system 1040 may include a separate controller (e.g., DRAM controller) for controlling the external memory (e.g., DRAM 1060).

The peripheral circuit 1050 may provide an environment necessary for the SoC system 1000 to be smoothly connected to an external device (e.g., a main board). Accordingly, the peripheral circuit 1050 may include a variety of interfaces to be compatible with an external device connected to the SoC system 1000.

The DRAM 1060 may function as an operation memory necessary for the application processor 1001 to operate. In some embodiments of the present inventive concept, the DRAM 1060 may be disposed on the outside of the application processor 1001 as illustrated. Specifically, the DRAM 1060 and the application processor 1001 may be packaged in the form of Package on Package (PoP). At least one of the semiconductor devices according to the above-described embodiments of the present inventive concept may be employed in the SoC system 1000.

Figure 17:
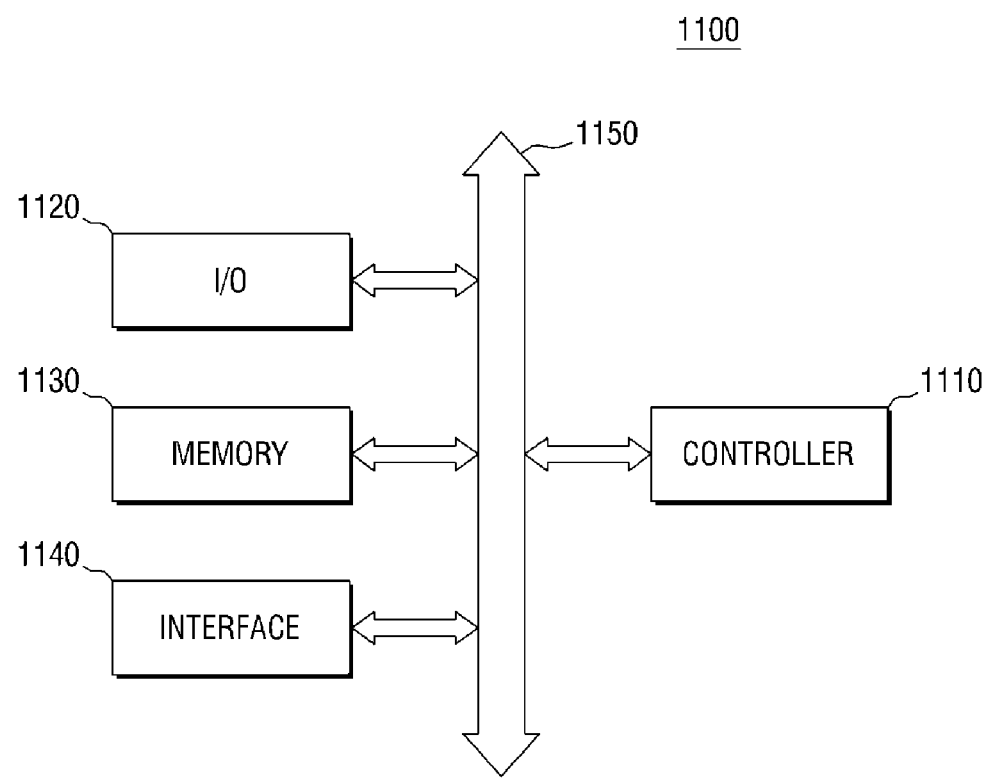
FIG. 17 is a block diagram of an electronic system including a semiconductor device according to embodiments of the present inventive concept.

FIG. 17 is a block diagram of an electronic system including a semiconductor device according to some embodiments of the present inventive concept. Referring to FIG. 17, an electronic system 1100 may include a controller 1110, an input/output (I/O) device 1120, a memory device 1130, an interface 1140, and a bus 1150.

The controller 1110, the I/O device 1120, the memory device 1130, and/or the interface 1140 may be coupled to each other through the bus 1150. The bus 1150 corresponds to a path through which data are transferred. The controller 1110 may include at least one of a micro-processor, a digital signal processor, a micro-controller and other logic devices capable of performing functions similar to those thereof.

The I/O device 1120 may include a keypad, a keyboard and a display device and the like. The memory device 1130 may store data and/or commands. The interface 1140 serves to transmit/receive data to/from a communication network. The interface 1140 may be of a wired or wireless type. For example, the interface 1140 may include an antenna or a wired/wireless transceiver or the like.

Although not shown, the electronic system 1100 may further include a high-speed DRAM and/or SRAM as an operating memory for improving the operation of the electronic system 1100. At least one of the semiconductor devices according to the above-described embodiments of the present inventive concept may be employed as a component in the electronic system 1100. The electronic system 1100 may be applied to a personal digital assistant (PDA), a portable computer, a web tablet, a wireless phone, a mobile phone, a digital music player, a memory card, or any electronic product capable of transmitting and/or receiving information in a wireless environment.

Figure 18:
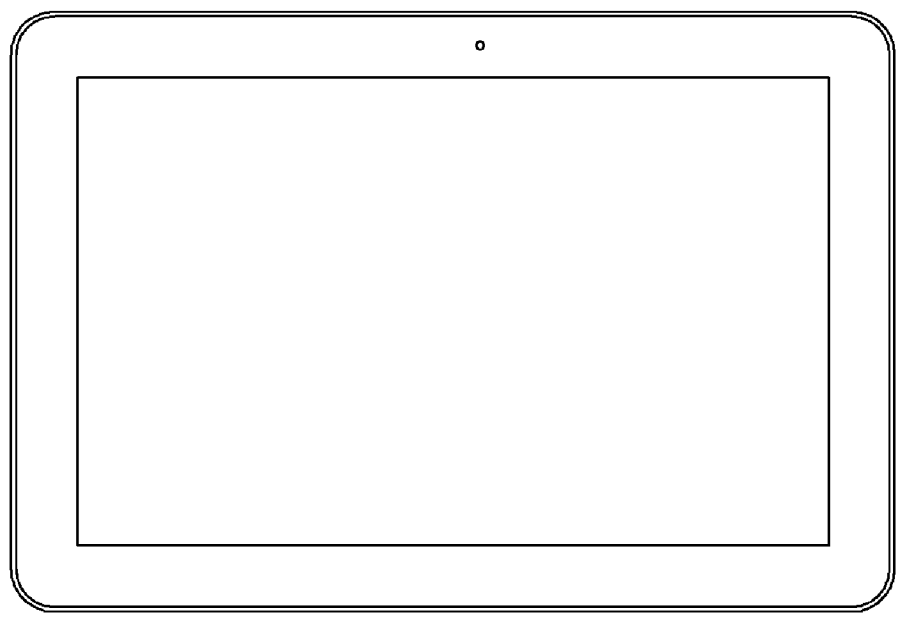
FIGS. 18 to 20 show exemplary semiconductor systems to which the semiconductor device according to embodiments of the present inventive concept is applicable.
Figure 19:
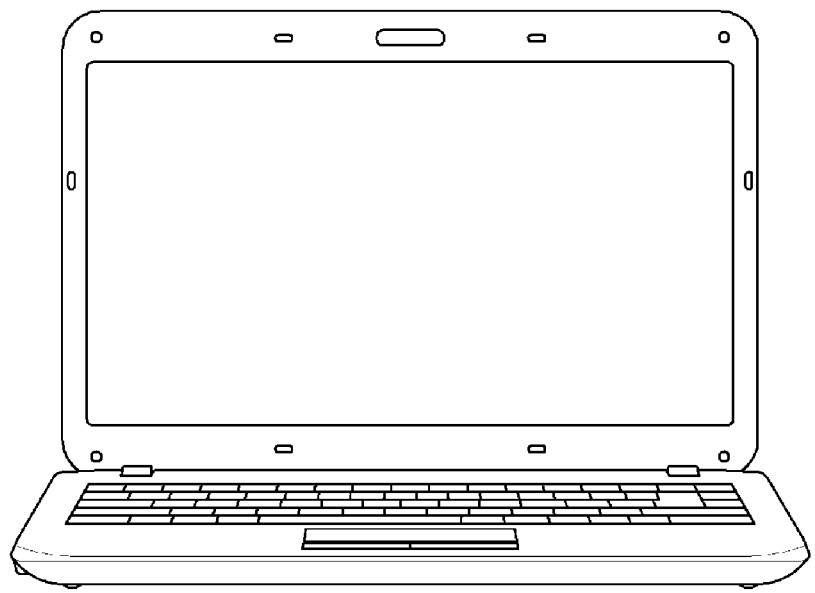
Figure 20:
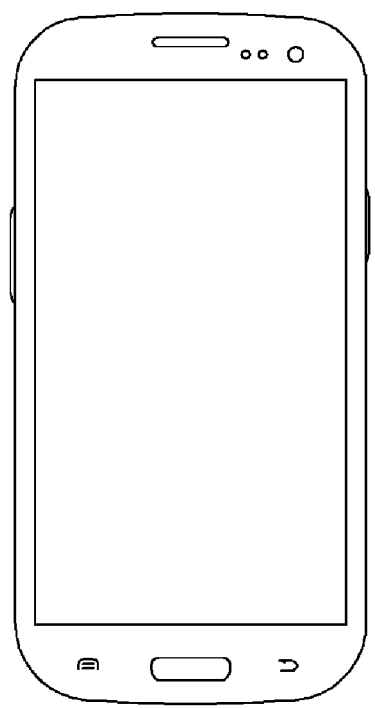

FIGS. 18 to 20 show exemplary semiconductor systems to which the semiconductor device according to some embodiments of the present inventive concept is applicable. FIG. 18 shows a tablet PC 1200, FIG. 19 shows a laptop 1300, and FIG. 20 shows a smart phone 1400. The semiconductor device according to some embodiments of the inventive concept described herein may be used in the tablet PC 1200, the laptop 1300, the smart phone 1400 or the like.

It will be understood that the semiconductor device according to embodiments of the present inventive concept can be applied to other integrated circuit devices that are not illustrated. That is, as examples of the semiconductor system according to the embodiments of the present inventive concept, only the tablet PC 1200, the laptop 1300, and the smart phone 1400 have been mentioned, but an example of the semiconductor system according to the present embodiment is not limited thereto.

In some embodiments of the present inventive concept, the semiconductor system may be implemented as a computer, a ultra mobile personal computer (UMPC), a workstation, a net-book, a personal digital assistant (PDA), a portable computer (PC), a wireless phone, a mobile phone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, or the like.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device including a modulator for phase shift keying (PSK) communication, comprising:
    a reference clock generator configured to generate a reference clock signal;
    a phase locked loop (PLL) configured to receive the reference clock signal and generate a first clock signal having a frequency different from a frequency of the reference clock signal;
    an integer divider circuit configured to generate a second clock signal by delaying a rising edge of the reference clock signal by a product of (a) a predetermined integer value included in transmission data and (b) a phase interval; and a processing unit configured to generate a first transmission signal, wherein the first transmission signal is phase-shifted from a first rising edge of the second clock signal, wherein the phase interval is dependent on a ratio of the frequency of the first clock signal to the frequency of the reference clock signal.

2. The semiconductor device of claim 1, wherein the ratio of the frequency of the first clock signal to the frequency of the reference clock signal is M, the phase interval is determined by 360° divided by M, and M is non-zero.

3. The semiconductor device of claim 1, further comprising a pulse generator circuit configured to receive the reference clock signal and generate a reset reference clock signal, wherein:

the integer divider circuit is configured to receive the reset reference clock signal from the pulse generator circuit to generate a third clock signal, and the processing unit is configured to generate a second transmission signal, wherein the second transmission signal is phase-shifted from a first rising edge of the third clock signal.

4. The semiconductor device of claim 3, wherein the integer divider circuit is configured to generate the third clock signal by delaying a rising edge of the reset reference clock signal by a product of the integer value and the phase interval.

5. The semiconductor device of claim 3, wherein the pulse generator circuit is configured to generate the reset reference clock signal according to a predetermined period.

6. The semiconductor device of claim 3, wherein:

the pulse generator circuit is configured to generate a first reset reference clock signal and a second reset reference clock signal, and the integer divider circuit is configured to generate the third clock signal based on a rising edge of the first reset reference clock signal, and to generate a fourth clock signal based on a rising edge of the second reset reference clock signal.

7. The semiconductor device of claim 6, wherein:

the processing unit is configured to generate a third transmission signal, the third transmission signal is phase-shifted from a rising edge of the fourth clock signal, and the third transmission signal is different from the second transmission signal.

8. The semiconductor device of claim 1, wherein the processing unit is configured to generate the first transmission signal having a value delayed by a width between the first rising edge of the second clock signal and a second rising edge closest to the first rising edge of the second clock signal.

9. The semiconductor device of claim 1, wherein the semiconductor device comprises a Near Field Communication (NFC) transmitter configured to transmit the first transmission signal.

10. A semiconductor device including a modulator for phase shift keying (PSK) communication, comprising:

an integer divider circuit configured to receive a first clock signal having a frequency that is a multiple of a frequency of a reference clock signal, to receive a reset reference clock signal, and to generate a second clock signal by delaying a rising edge of the reset reference clock signal by a product of (a) a predetermined integer value included in transmission data and (b) a phase interval; and a processing unit configured to generate a first transmission signal, wherein the first transmission signal is phase-shifted from a first rising edge of the second clock signal, wherein the phase interval is dependent on a ratio of the frequency of the first clock signal to the frequency of the reference clock signal.

11. The semiconductor device of claim 10, wherein the ratio of the frequency of the first clock signal to the frequency of the reference clock signal is M, the phase interval is determined by 360° divided by M, and M is non-zero.

12. The semiconductor device of claim 10, wherein:

the integer divider circuit is configured to receive a first reset reference clock signal and a second reset reference clock signal, the integer divider circuit is configured to generate the second clock signal based on a rising edge of the first reset reference clock signal, and the integer divider circuit is configured to generate a third clock signal based on a rising edge of the second reset reference clock signal.

13. The semiconductor device of claim 12, wherein:

the processing unit is configured to generate a second transmission signal, the second transmission signal is phase-shifted from a rising edge of the third clock signal, and the second transmission signal is different from the first transmission signal.

14. The semiconductor device of claim 10, wherein the processing unit is configured to generate the first transmission signal having a value delayed by a width between the first rising edge of the second clock signal and a second rising edge closest to the first rising edge of the second clock signal.

15. The semiconductor device of claim 10, wherein the semiconductor device comprises a Near Field Communication (NFC) transmitter configured to transmit the first transmission signal.

16. A semiconductor device including a demodulator for phase shift keying (PSK) communication, comprising:

a phase detector circuit configured to receive a first clock signal and generate a second clock signal by detecting a phase shift value of the first clock signal;

a phase locked loop (PLL) configured to generate a third clock signal having a frequency that is a multiple of a frequency of a reference clock signal; and a counter unit configured to calculate an integer value corresponding to a delayed phase value by comparing the second clock signal with the third clock signal, wherein the demodulator is configured to perform a demodulation dependent on the delayed phase value;

wherein the phase detector circuit is configured to cause the second clock signal to have a logic level value corresponding to a width between a first rising edge of the reference clock signal and a first rising edge of the first clock signal, and wherein when a second rising edge of the first clock signal is ahead of a second rising edge of the reference clock signal, the phase detector circuit is configured to cause the second clock signal to have a logic level value corresponding to a width between the second rising edge of the reference clock signal and a third rising edge closest to and after the second rising edge of the first clock signal.

17. The semiconductor device of claim 16, wherein a ratio of the frequency of the third clock signal to the frequency of the reference clock signal is M, a phase interval is determined by 360° divided by M, and M is non-zero.

18. The semiconductor device of claim 17, wherein the counter unit is configured to calculate the integer value as a ratio of the phase shift value to the phase interval.

19. The semiconductor device of claim 16, wherein the logic level value is a high level logical value.

20. The semiconductor device of claim 16, wherein the semiconductor device comprises a Near Field Communication (NFC) receiver configured to receive the first clock signal.

* * * * *